United States Patent
Köhler

(10) Patent No.: US 11,275,143 B2
(45) Date of Patent: Mar. 15, 2022

(54) METHOD FOR MEASURING EDDY CURRENT FIELDS IN A MAGNETIC RESONANCE DEVICE, MAGNETIC RESONANCE DEVICE, COMPUTER PROGRAM AND ELECTRONICALLY READABLE DATA CARRIER

(71) Applicant: Siemens Healthcare GmbH, Erlangen (DE)

(72) Inventor: Michael Köhler, Nuremberg (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/907,598

(22) Filed: Jun. 22, 2020

(65) Prior Publication Data
US 2020/0400770 A1    Dec. 24, 2020

(30) Foreign Application Priority Data
Jun. 24, 2019 (DE) .......................... 102019209079.6

(51) Int. Cl.
*G01R 33/565*    (2006.01)
*G01R 33/54*    (2006.01)

(52) U.S. Cl.
CPC ..... *G01R 33/56518* (2013.01); *G01R 33/543* (2013.01)

(58) Field of Classification Search
CPC .......................... G01R 33/56518; G01R 33/543
See application file for complete search history.

(56) References Cited

U.S. PATENT DOCUMENTS 4,698,591 A    10/1987    Glover et al.
5,770,943 A *    6/1998    Zhou ................ G01R 33/56518
                                                      324/307

(Continued)

FOREIGN PATENT DOCUMENTS

DE          19750637 A1      7/1998

OTHER PUBLICATIONS

German Office Action for German Application No. 10 2019 209 079.6 dated Apr. 27, 2020.

*Primary Examiner* — G. M. A Hyder
(74) *Attorney, Agent, or Firm* — Lempia Summerfield Katz LLC

(57) ABSTRACT

Systems and methods for measuring eddy current fields occurring as a result of gradient pulses in a magnetic resonance sequence at a point in time during the magnetic resonance sequence in relation to at least one direction of pulse effect. At least the parts of the magnetic resonance sequence comprising the gradient pulses relating to the at least one direction of pulse effect are performed as a preparation sequence up until the point in time followed directly by a measurement sequence in which first measurement data is recorded. The preparation sequence is played out again with the same, directly consecutive measurement sequence without the gradient pulses relating to the at least one direction of pulse effect or with gradient pulses having an inverted sign relating to the at least one direction of pulse effect. Second measurement data is recorded. Using a joint evaluation of the first and second measurement data at least one variable characterizing the eddy current field generated by the eddy currents of the gradient pulses in the at least one direction of pulse effect is determined.

20 Claims, 3 Drawing Sheets

(56) References Cited

U.S. PATENT DOCUMENTS

| | | | |
|---|---|---|---|
| 6,331,777 B1* | 12/2001 | Van Den Brink | ............................ G01R 33/56341 324/307 |
| 7,141,970 B2* | 11/2006 | Miyawaki | ........ G01R 33/56518 324/307 |
| 9,188,656 B2* | 11/2015 | Yui | .................. G01R 33/56518 |
| 2006/0022674 A1* | 2/2006 | Zhou | ................ G01R 33/56518 324/309 |
| 2012/0098535 A1 | 4/2012 | Kaneta et al. | |

\* cited by examiner

METHOD FOR MEASURING EDDY CURRENT FIELDS IN A MAGNETIC RESONANCE DEVICE, MAGNETIC RESONANCE DEVICE, COMPUTER PROGRAM AND ELECTRONICALLY READABLE DATA CARRIER

CROSS REFERENCE TO RELATED APPLICATIONS

This application claims the benefit of DE 102019209079.6 filed on Jun. 24, 2019, which is hereby incorporated by reference in its entirety

FIELD

Embodiments relate to a system and method for measuring eddy current fields occurring as a result of gradient pulses of a magnetic resonance sequence at a point in time during the magnetic resonance sequence in relation to at least one direction of pulse effect.

BACKGROUND

Magnetic resonance imaging is an established modality, for example in medical engineering. Nuclear spins aligned in a main magnetic field, for example in a patient, are excited by radio frequency pulses and the decay of the excitation is measured. Today's research with regard to magnetic resonance devices is aimed at improving image quality.

Magnetic fields induced by eddy currents, also referred to as eddy current fields, that may occur during a magnetic resonance sequence, represent a problem in the connection. Since the eddy current fields may include a negative influence on the functionality of the magnetic resonance sequence, for example on account of poor fat saturation, spatial distortions, or destructive interferences between different echo configurations, it is helpful to measure the undesirable disturbances of the static main magnetic field.

Eddy currents may be generated in magnetic resonance devices by changes to magnetic fields over time, for example by the switching of gradient pulses. As a result of the change to the magnetic field over time, each ramp of a gradient pulse may generate eddy currents in conductive structures of the magnetic resonance device. Eddy currents in turn cause time-dependent eddy current fields, that may in principle include different geometries. After the ramp of a gradient pulse that generates an eddy current, an exponential decay of the magnetic field thus generated is often assumed for reasons of simplicity:

$$B_{EC}(t) \_ \exp(-t/\tau). \tag{1}$$

$B_{EC}(t)$ refers to the magnetic field (eddy current field) generated by the eddy current, t refers to the time and τ refers to the time constant of the eddy current. The eddy current fields generated by gradient pulses, hence field errors, may also include oscillating components that are however overlaid by the exponential decay shown above. Oscillations may be generated for example by mechanical vibration. If a reference gradient pulse is considered, it is determined that the magnetic field induced by eddy currents, in other words the eddy current field, thus generated may vary strongly in its magnitude, the spatial distribution and the time constant between different magnetic resonance devices. Dependencies of the eddy currents on the gradient axis, in other words for example X, Y, Z, are also usually determined. The variations occur both between different magnetic resonance device types and between different instances of a type. Manufacturing tolerances make a significant contribution to the variations.

Customary magnetic resonance sequences contain a large number of gradient pulses. The different gradient pulses may generate a dynamic disturbance of the main magnetic field during the course of the magnetic resonance sequence. The disturbance may depend on the parameterization of the selected magnetic resonance sequence, since stronger gradients or greater average gradient amplitudes generally lead to greater eddy current fields, in other words field disturbances. At certain points in time within a magnetic resonance sequence, the image quality of the magnetic resonance image being generated reacts sensitively to disturbances of the magnetic field.

An example of such a point in time is the point in time at which a radio frequency pulse used for fat saturation is output. Since many fat saturation techniques exploit the chemical shift between fat and water, the fat saturation generally reacts sensitively to disturbances of the magnetic field. The disturbance may result for example in the magnetic resonance signal being inadequately suppressed by protons bound in fat, or in the signal being suppressed in an unwanted manner by protons bound in water.

EPI sequences (EPI: echo planar imaging) with diffusion encoding are another example. Because the diffusion gradients usually include high amplitudes or large gradient moments, the diffusion gradients may also generate considerable eddy currents. EPI measurements react sensitively to disturbances of the magnetic field, that may be expressed, for example, as spatial distortions. The field disturbances during the readout train or readout module are relevant for the distortions, above all during the recording of the k-space center, in other words of the echo.

Methods have been proposed for measuring eddy currents generated by gradient pulses or the corresponding eddy current fields. The methods measure the phase error generated by the eddy currents or the eddy current fields, that are caused by a certain ramp of a reference test gradient pulse. The entire sequence is executed twice. In the second execution the amplitude of the test gradient pulse is inverted relative to the first, in other words the sign is changed. The phase difference of the two acquisitions is then used as the measurement variable. Because all other parts of the magnetic resonance sequence except for the test gradient pulse are identical, their contributions to a phase variation cancel each other out. The measured differential phase is caused solely by the effects of the test gradient pulse, hence by the eddy currents.

U.S. Pat. No. 4,698,591 A discloses a method for compensating eddy current effects caused by magnetic field gradients. Here, a test gradient pulse is applied to a sample, whereupon a 90° radio frequency pulse is applied. The phase of the resulting FID signal (FID: free induction decay) is monitored as a function of the total time since the end of the gradient pulse. The data is set in relation to the gradient pulse response.

U.S. Pat. No. 5,770,943 A relates to a method for measuring and compensating magnetic fields, variable in terms of space and time, that are generated by eddy currents. Here, as described above, a certain test gradient pulse is output once with a positive sign and once with a negative sign, and phase images are measured, that are subtracted from one another in order to calculate eddy current amplitudes and time constants.

US 2012/0098535 A1 relates to a magnetic resonance device and a method for eddy current compensation. The object set there is to correct an eddy current field not only in the direction of application of the gradient field but also in a direction that differs therefrom. It is proposed to use a test gradient pulse and to measure eddy currents in different directions.

With this and similar methods, it is possible to measure the spatial distribution of the field interactions caused by the eddy currents. Moreover, it is possible with some methods to determine the time constant of the generated eddy currents. The findings may then be used for example to play out correction gradient pulses that serve to compensate the eddy current fields. This type of eddy current compensation is already known. However, in commercially available magnetic resonance devices it is only possible to compensate eddy current fields that may be approximated by linear combinations, hence combinations of different gradients. Higher spatial contributions, for example of the second or third order as a function of one or several spatial coordinates, cannot be corrected dynamically in commercially available magnetic resonance devices.

The measurement of amplitude, time constant and spatial distribution of the eddy current fields as a consequence of a reference test gradient pulse makes it possible in principle to calculate the field disturbances for a selected magnetic resonance sequence with a selected parameterization. The calculations are however extremely time-consuming and labor-intensive as well as prone to error, and also require an exact characterization based on extensive calibration measurements of the respective magnetic resonance device in order to receive reliable results.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide for the direct measurement of field disturbances caused by eddy currents in selected magnetic resonance sequences within a reasonable time.

Embodiments provide a method for measuring eddy current fields occurring as a result of gradient pulses in a magnetic resonance sequence at a point in time during the magnetic resonance sequence in relation to at least one direction of pulse effect. At least the parts of the magnetic resonance sequence including the gradient pulses relating to the at least one direction of pulse effect are played out as a preparation sequence up until the point in time followed directly by a measurement sequence in which first measurement data is recorded. Whereupon, after a waiting time, the preparation sequence is played out again with the same, directly consecutive measurement sequence without the gradient pulses relating to the at least one direction of pulse effect or with gradient pulses including an inverted sign relating to the at least one direction of pulse effect. Second measurement data is recorded whereby using a joint evaluation of the first and second measurement data at least one variable characterizing the eddy current field generated by the eddy currents of the gradient pulses in the at least one direction of pulse effect is determined.

Embodiment provide a method for measuring eddy current fields where eddy current fields occur as a result of gradient pulses of a magnetic resonance sequence at a point in time during the magnetic resonance sequence in relation to at least one direction of pulse effect. At least the parts of the magnetic resonance sequence that include the gradient pulses relating to the at least one direction of pulse effect are played out as a preparation sequence up until the point in time. The preparation sequence is followed directly by a measurement sequence in which first measurement data is recorded, whereupon, after a waiting time, the preparation sequence is played out without the gradient pulses relating to the at least one direction of pulse effect or with gradient pulses including an inverted sign compared to the gradient pulses relating to the at least one direction of pulse effect. Directly consecutively thereto, the same measurement sequence is played out again, in which second measurement data is recorded. Using a joint evaluation of the first and second measurement data at least one variable characterizing the eddy field generated by the eddy currents of the gradient pulses in the at least one direction of pulse effect is determined.

All directions of pulse effect may be considered as the at least one direction of pulse effect, hence all gradient pulses of the magnetic resonance sequence are initially output up until the point in time and then omitted or inverted. A restriction is expedient only if information is explicitly required for just one part of the directions of pulse effect or a single direction of pulse effect. Directions of pulse effect are to be understood here in relation to patient pulses, in other words as logical and/or physical gradient directions. Logical gradient directions refer to functional gradient directions, for example at least one phase encoding direction, at least one slice selection direction and/or at least one readout direction. For a cylindrical patient aperture, the X, Y and Z directions may be defined such that the Z direction corresponds to the direction of the main magnetic field and the axial direction of the patient aperture. The Y direction is the vertical direction perpendicular thereto, while the X direction is the horizontal direction perpendicular thereto. The eddy current field is expediently measured independently thereof in all spatial directions.

The method makes it possible to measure the disturbances of the magnetic field caused by eddy currents at relevant point in times in magnetic resonance sequences (especially those used for diagnostic investigations). The method is helpful for characterization and problem analysis, as it may be used for example to investigate image artifacts in more detail. The quantification of the eddy current fields may help when analyzing whether certain artifacts are attributable to eddy currents or whether other causes must be taken into account. The measurement method may also help to select parameters of the magnetic resonance sequence such that the field disturbances induced by eddy currents remain below certain limits. Embodiments or the result thereof, the variable characterizing the eddy current field, may also be used to parameterize other compensation measures.

The method is configured to measure eddy currents occurring in a magnetic resonance sequence. The magnetic resonance sequence or parts of the magnetic resonance sequence, referred to as the preparation sequence, are played out and followed by elements of a further magnetic resonance sequence, e.g. the measurement sequence. The preparation sequence acts as a kind of preparation to generate an eddy current state; the field disturbance resulting therefrom, in other words the eddy current field, is then measured by the elements of the measurement sequence.

The method may be used, as already described, to analyze image quality problems in order to find out whether and to what extent the image quality problems are caused by eddy currents. The proposed method may also be used with regard to compensation measures. In this context, there are several clear advantages.

On the one hand, the method provides a direct measurement of the field disturbances induced by eddy currents in realistic clinical magnetic resonance sequences, as a function of the parameterizations used for the underlying magnetic resonance sequences. In comparison with methods of the prior art, no "diversions" via measurements with test gradient pulses and (possibly error-prone) conversions are necessary. The method offers possibilities for analyzing image quality problems, both during development and during the use of magnetic resonance devices already installed and/or in routine clinical operation. It makes it possible to analyze whether and to what extent eddy current effects contribute to the occurrence of image quality problems.

The method further makes it possible to separate different effects by quantifying only the eddy current effects for a given sequence with adjustable parameterizations. Other effects, such as static main field inhomogeneities, do not influence the quantification. It is further made possible, by measurements with different parameters of the magnetic resonance sequence, to determine the parameter set that minimizes the effects induced by eddy currents.

In this context, the method may be applied to different magnetic resonance sequences to measure the field disturbances induced by eddy currents occurring during the sequences.

The method is based on a measurement that represents a combination of two individual sequences. The preparation sequence is a realistic clinical/diagnostic magnetic resonance sequence or a part thereof that is used to prepare a certain eddy current state, while the measurement sequence is used to measure this eddy current state. The basic elements are repeated in a suitable manner in order to measure the desired effects.

Further advantages of the method include the ability to detect eddy current problems at an early stage in the development of new magnetic resonance devices and new magnetic resonance sequences or magnetic resonance sequence protocols, that may result in shorter development times. A simplified analysis of image quality problems in magnetic resonance devices in use is also enabled, as a result of which remedial measures may also be identified more quickly.

In an embodiment, the point in time may be selected as a point in time of output of a radio frequency pulse of the magnetic resonance sequence, for example of a preparation pulse that may be frequency-selective, or as a point in time of measurement of the k-space center. Furthermore, it is also possible to consider the entire magnetic resonance sequence as the preparation sequence or to consider the end point of the magnetic resonance sequence as the point in time. The point in time up to which at least gradient pulses of the magnetic resonance sequence are played out as the preparation sequence may be selected freely or specified in a fixed manner. It corresponds to the point in time within the magnetic resonance sequence at which the field disturbances induced by eddy currents are to be quantified. This point in time may correspond for example to the point in time at which a fat saturation pulse is played out or the point in time at which the k-space center is recorded.

The method starts by playing out the preparation sequence. It may be more expedient not to play out radio frequency pulses of the magnetic resonance sequence in the preparation sequence, since those with only little if any influence on eddy current effects, and hence the effort involved, may be reduced by radio frequency pulses of the magnetic resonance sequence not being generated in the preparation sequence. Furthermore, it is also not necessary to play out all gradient pulses if only the gradient pulses of the at least one direction of pulse effect are concerned. It is therefore also possible for all gradient pulses not acting in the at least one direction of pulse effect to be omitted in an embodiment. It is therefore possible only to play out the gradient pulses in the directions of pulse effect for which the eddy currents are to be characterized.

In an embodiment, provision may be made for the preparation sequence or elements thereof to be played out multiple times before each measurement sequence. In this way, it is possible to prepare a steady state of the eddy currents as it would also occur during the course of the actual magnetic resonance sequence, as this or basic elements thereof will usually be used repeatedly. This provides a reliable measurement of the mainly relevant state.

The preparation sequence is followed by the measurement sequence, that may not be identical to the magnetic resonance sequence or parts thereof for which the eddy currents are to be characterized. In this way, the magnetic resonance signal is recorded in the form of measurement data. In general, the measurement sequence includes at least one radio frequency pulse and at least one readout module (data recording window), e.g. a data acquisition window.

The measurement sequence is a gradient echo sequence (GRE sequence). Gradient echo-based sequences are preferred as measurement sequences, since a shorter measurement time is required than for spin echo-based sequences. Moreover, disturbances of the main magnetic field in gradient echo sequences lead directly to a measurable influence on the phase of the magnetic resonance signal. If spin echo sequences (SE sequences) were to be used, the echo time (TE) and the time between the centers of the excitation and refocusing pulses ($T_{PulseDelta}$) is usually selected as $TE = 2 \cdot T_{PulseDelta}$ for these, as a result of which static field disturbances and field disturbances that decay with a comparably long time constant have no measurable influence on the phase. In order nevertheless to measure these it would be necessary to deviate from the stated condition.

In an embodiment, the measurement sequence may measure in a spatially resolved manner in at least one spatial direction. The measurement sequence may allow a spatial resolution (segmentation) in at least one spatial direction. The measurement sequence then contains gradient pulses on the axes in relation to which a spatial resolution is to be achieved. A spatial resolution in three spatial directions may be used. In this way, spatially resolved information about the eddy current fields is received.

In an embodiment of the method, it may also be provided that the measurement sequence samples just one part of the k-space to be sampled, and first and second measurement data is recorded for all parts of the k-space to be sampled in several recording sections. For example, one or more k-space rows may be recorded as part of the k-space to be sampled. The measurement of a single k-space row per measurement sequence may be used, for example if a spatial resolution is to be used. The interleaving with regard to the first and the second measurement data and parts of the k-space to be sampled may be performed arbitrarily. For example, a waiting time may be provided between two complete sequences, hence sequences of at least one preparation sequence and one measurement sequence for recording measurement data, so that the field disturbances induced by eddy currents may in each case disappear again before a new preparation of an eddy current state and subsequent measurement takes place.

First and second measurement data is recorded in the method that differ from one another with regard to the preparation, for example with regard to the gradient pulses of the at least one direction of pulse effect. The same measurement sequence is used for the first and second measurement data, but the preparation sequence changes with regard to the gradient pulses of the at least one direction of pulse effect. The at least one direction of pulse effect may (normally) include all directions of pulse effect, although if a restriction is to be applied, that the at least one direction of pulse effect (at least one logical and/or physical axis) corresponds to the direction of pulse effect or combination of directions of pulse effect for which the eddy current fields are to be quantified. In this context, there may be two possibilities. In one embodiment, the gradient pulses that effect a gradient in the at least one direction of pulse effect are inverted during the recording of the second measurement data in comparison with the recording of the first measurement data, in other words their sign changes. The embodiment may be used if the measurable effects are slight and the ratio of measured effect and noise is to be maximized. In a second embodiment, the gradient pulses of the at least one direction of pulse effect may be omitted when recording the second measurement data, whereas the at least one direction of pulse effect were played out during the recording of the first measurement data.

Therefore, two (initially complex) measurement datasets S1 and S2 are measured, that differ from one another as a result of the changed playout of the gradient pulses of the at least one direction of pulse effect in the preparation sequence.

In an embodiment, an evaluation of the phase and/or the amplitude of the measurement data takes place to determine the variable, for example as the difference between corresponding first and second measurement data. The measured phase and/or the measured magnitude of the magnetic resonance signal may be evaluated for the quantitative acquisition of the eddy current fields. The quantification on the basis of the measured phases may be used. The first and the second measurement data may be or include phase images. The embodiment of the evaluation may take place as in the methods of the prior art mentioned in the introduction, in which the eddy current field is measured by test gradient pulses.

In the quantification by evaluating the magnitude, use is made of the fact that field disturbances induced by eddy currents may lead to spatial distortions of the measured magnetic resonance image. On account of the different spatial distortions in the first measurement data and the second measurement data, conclusions may therefore be drawn regarding the underlying eddy current fields.

In the evaluation based on the phase differences of the measurement datasets S1 and S2, use is made of the fact that the undisturbed signal S is influenced by eddy current fields $B_{EC}$, wherein different spatial distortions in the two datasets are disregarded here. This provides:

$$S \to S \exp(i\gamma \int B_{EC}(t)dt). \quad (2)$$

Here, $\gamma$ refers to the gyromagnetic ratio and i is the imaginary unit. The integration extends over the time period in which the phase is accumulated by field disturbances during the measurement sequence. In the case of a gradient echo sequence as the measurement sequence, this is the echo time (TE). The subsequent consideration takes into account only the eddy current fields of the at least one direction of pulse effect for which the gradient pulses were played out differently during recording of the measurement datasets S1 and S2. The following applies for the phase difference of first and second measurement data S1 and S2:

$$\Delta_\varphi = k\gamma \int B_{EC}(t)dt \approx k\gamma B_{EC} T. \quad (3)$$

The approximation applies to the (simplified) case that the eddy currents decay with a time constant that is significantly longer than the time T during which phase accumulations occur in the respectively used measurement sequence. As already mentioned above, T corresponds to the echo time for gradient echo sequences. For the variable k introduced in formula (3), k=2 if during the measurement of the second measurement data S2 the gradient pulses on the axis or axis combination (i.e. the at least one direction of pulse effect) to be characterized are inverted, and k=1 if during the measurement of the second measurement data S2 the gradient pulses of the at least one direction of pulse effect are not played out, whereas the gradient pulses were played out during the measurement of the first measurement data S1.

The sign of the measured phase difference depends on the sequence of formation of the phase difference as well as on the polarity of the gradient pulses in the measurement of the first and second measurement dataset S1 and S2.

The equation (3) may be used to calculate the eddy current field $B_{EC}$ that is present at the end of the playout of the preparation sequence.

In an embodiment, where sequences programmed in an object-oriented manner are used, the combination of preparation sequence and measurement sequence is generated as a complete sequence from a base class describing the preparation sequence and/or the complete magnetic resonance sequence. For the software-related implementation of the method, today's magnetic resonance sequences may be programmed in an object-oriented manner. The entire measurement of measurement data, in other words the combination of the preparation sequence and the measurement sequence with the repetitions of the individual elements, as described above, as a complete sequence programmed in an object-oriented manner, that is derived from the preparation sequence acting as the base class. This is then supplemented with the components required to carry out the measurement sequence. The implementation of the preparation sequence with the large number of parameterization possibilities is significantly more time-consuming and labor-intensive than the implementation of the components of the measurement sequence. The implementation may already be available in the form of the magnetic resonance sequence, that indeed forms the basis. In one development of this approach, it may be provided that a base class is also used for the measurement sequence. The complete sequence is generated by multiple inheritance from both base classes.

The implementation based on inheritance offers the advantage that, with little effort, it is possible to create different versions of the complete sequence based on different variants of the preparation sequence, for example for turbo spin echo sequences (TSE sequences), EPI diffusion sequences, etc. This makes it easy to implement complete sequences that measure the eddy current behavior for different clinical magnetic resonance sequences. As a result of the inheritance, the new, derived class now offers all (or the most important and expedient) functionalities of the original base class. This is advantageous, for example, to measure the effects of the eddy currents that occur during the playout of clinically or diagnostically relevant magnetic resonance sequences with different parameterizations, corresponding to different values of the protocol parameters. It is therefore advantageous if the underlying magnetic resonance sequence may be used directly as the basis, without the need firstly to retrospectively program the behavior of this sequence. A retrospective programming might be more time-consuming and labor-intensive, and there would be the risk of an incomplete match.

The variable may be generated successively for several different points in time and/or directions of pulse effect and/or parameterizations of the magnetic resonance sequence. In this way, it is therefore possible to perform analyses to identify the causes of image quality problems, for example. Equally, it is possible for the variable characterizing the eddy current field to be evaluated in order to parameterize at least one compensation measure for the eddy current field. A compensation measure may be the use of compensation gradient pulses, for example. However, the result of the measurement using the method also makes it possible to determine parameters of the magnetic resonance sequence in such a way that the eddy current effects, for example at certain points in time, are minimized.

The measurement may be carried out in the patient aperture, for example through the use of phantoms, since the eddy current fields do not depend on the patient being examined.

In addition to the method, embodiments also provide a magnetic resonance device including a control device configured to carry out the method. The control device may include at least one processor and at least one storage device. The control device may also include various functional units for carrying out the steps of the method. For example, a selection unit may be provided in order to determine the point in time and/or the at least one direction of pulse effect and/or parameters of the magnetic resonance sequence (and thus of the preparation sequence). In all cases, the control device includes a sequence unit configured to output the correspondingly required sequences of preparation sequence and measurement sequence. The control device may also include an evaluation unit configured to determine the variable characterizing the eddy current field from the first and second measurement data. Further functional units may be provided in connection with the possible further embodiments of the method.

Embodiments provide a computer program includes programming to carry out the steps of the method when the computer program is executed on a control device of a magnetic resonance device. The computer program may be stored on an electronically readable data carrier, on which control information including a computer program is therefore stored and is configured such that when the data carrier is used in a control device of a magnetic resonance device, the steps of the method are carried out. The data carrier may be a non-transient data carrier, for example a CD-ROM.

DETAILED DESCRIPTION

Figure 1:
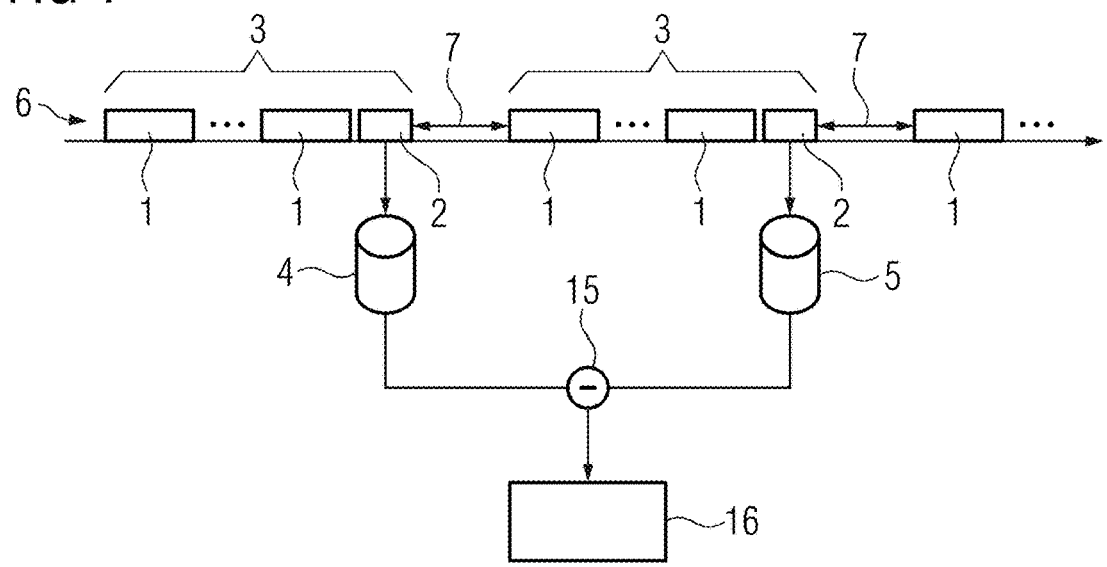
FIG. 1 depicts a relationship diagram according to an embodiment.

FIG. 1 depicts a functional sketch to explain a method for measuring eddy current fields occurring as a result of gradient pulses of a magnetic resonance sequence at a point in time during the magnetic resonance sequence in relation to at least one direction of pulse effect.

Parameters of the magnetic resonance sequence, the point in time and the at least one direction of pulse effect, for example as all directions of pulse effect of a Cartesian coordinate system, for example the X direction, the Y direction and the Z direction, for which gradient coils are also provided in the magnetic resonance device, are already predefined. The point in time is expediently to be selected as the end point of the magnetic resonance sequence or as a point in time during the execution of the magnetic resonance sequence at which the magnetic resonance sequence reacts sensitively to eddy current fields, that occur as field disturbances on account of eddy currents caused by gradient pulses of the magnetic resonance sequence. For example, the point in time may be the output of a preparation pulse, for example a fat saturation pulse, during the magnetic resonance sequence and/or the recording of the k-space center.

FIG. 1 depicts, in the upper part, a measurement process 6 formed as a sequence of complete sequences 3 formed from at least one preparation sequence 1 and one measurement sequence 2, for recording first and second measurement data 4, 5. The preparation sequences 1 correspond at least in relation to the gradient pulses to the execution of the magnetic resonance sequence up to the point in time. The preparation sequences contain all gradient pulses in the X, Y and Z direction that were also contained in the magnetic resonance sequence up to the point in time, in precisely the same temporal sequence. In this embodiment, radio frequency pulses of the magnetic resonance sequence are not part of the preparation sequence.

The repetition of the preparation sequence multiple times, for example four times, serves to establish a state of equilibrium in relation to the eddy currents and thus the eddy current fields, such as would also be produced in the event of multiple repetitions of the magnetic resonance sequence itself or parts thereof. For example, an eddy current state therefore occurs as a result of at least one output of the preparation sequence 1, which eddy current state is then measured by the measurement sequence 2.

This embodiment relates to a measurement of the eddy current fields occurring as a result of the eddy currents as field disturbances induced by eddy currents with regard to all physical gradient directions, in other words the X, Y and Z direction; it is however also possible to consider only individual ones of these directions of pulse effect or combinations of the directions of pulse effect. Individual or combinations of logical directions of pulse effect such as phase encoding direction, readout direction and slice selection direction are also possible. A complete sequence for recording first measurement data 4 relates to the polarity of the gradient pulses as it is also present in the magnetic resonance sequence, whereas during the recording of second measurement data 5 the gradient pulses are output inverted. If not all directions of a Cartesian coordinate system, but instead only individual directions of pulse effect are to be covered, then for recording second measurement data only the gradients of gradient pulses acting in this direction of pulse effect are inverted. In an embodiment, the gradient pulses of the at least one direction of pulse effect may also be omitted for recording the second measurement data. No gradient pulses would then be output. It is then possible for the second output of the preparation sequence 1 to act as a waiting time if it is also the case that, for example, no radio frequency pulses of the magnetic resonance sequence are output.

The measurement sequence differs from the magnetic resonance sequence and is selected as a gradient echo sequence. As indicated for the measurement process 6, further complete sequences 3 follow in the temporal sequence, with the spatially resolving measurement sequence always relating to one k-space row. As a result of complete sequences 3 that follow one another successively, first and second measurement data 4, 5 is recorded in each case for different k-space rows. The interleaving or sequence of the complete sequences is ultimately arbitrary.

A waiting time 7 may be used between two complete sequences 3, during which waiting time the eddy currents decay once again and thus the eddy current fields substantially disappear.

Figure 2:
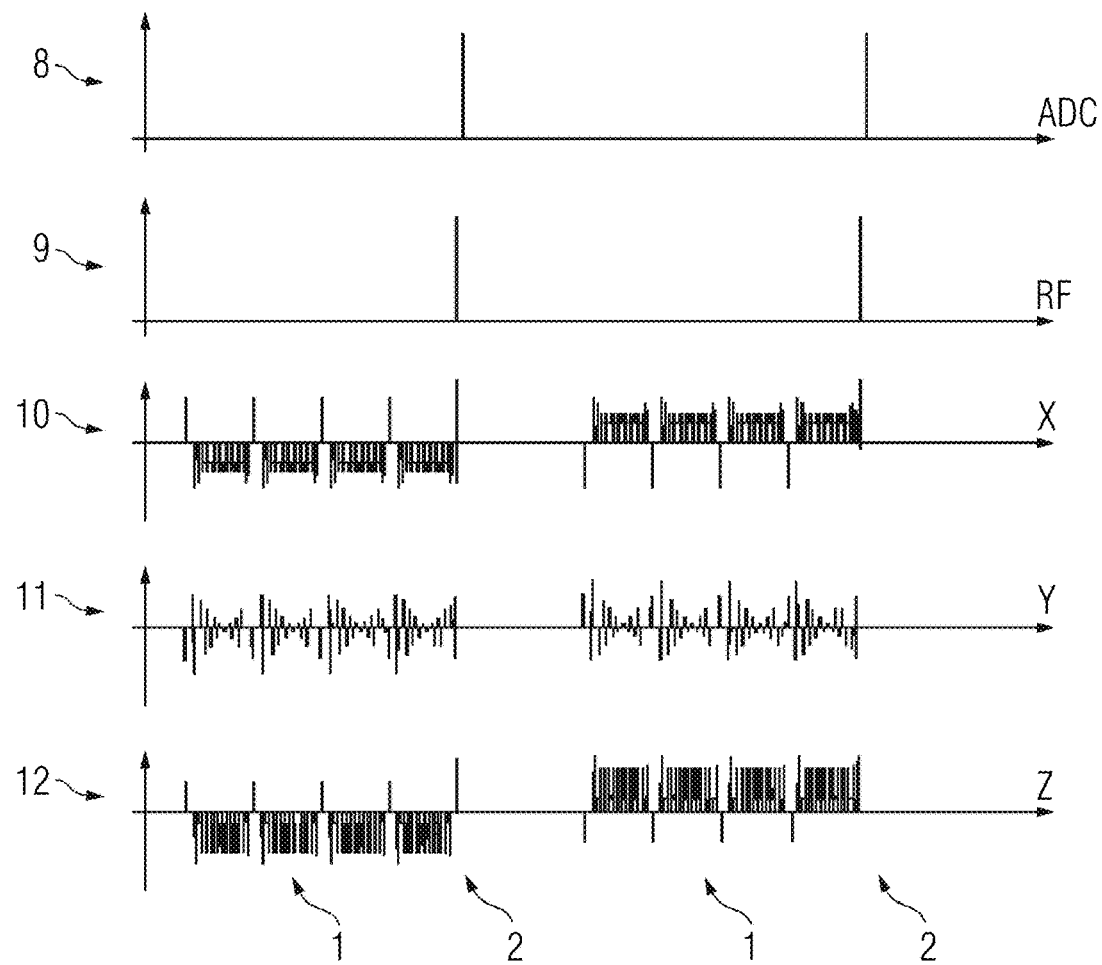
FIG. 2 depicts a sequence diagram for recording measurement data according to an embodiment.

FIG. 2 depicts a sequence diagram for two consecutive complete sequences 3. The top graph 8 depicts the ADC activity, hence readout periods, the second graph 9 depicts radio frequency pulses, the third graph 10 depicts gradient pulses of the X direction, the fourth graph 11 depicts gradient pulses of the Y direction, and the fifth graph 12 depicts gradient pulses of the Z direction. As may be identified by comparing the gradient pulse sequence of the first preparation sequence 1 with the gradient pulse sequences of the second preparation sequence 1, the polarity of the gradient pulses is in each case exactly opposite. The gradient pulses are inverted or their sign has changed.

Figure 3:
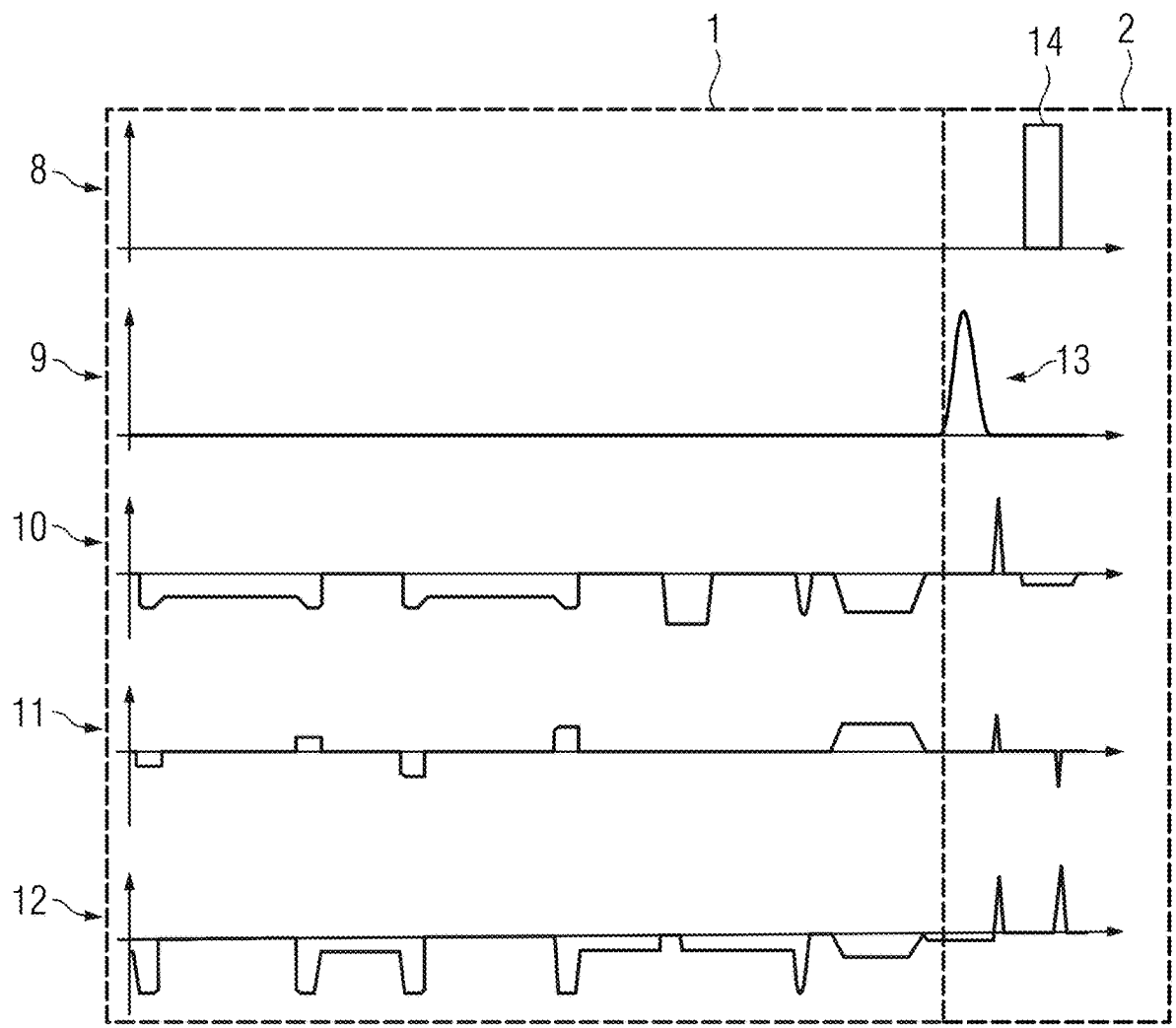
FIG. 3 depicts an enlarged partial section of the sequence diagram from FIG. 2 according to an embodiment.

FIG. 3 depicts a detail of the end section of the preparation sequence 1 and the measurement sequence 2. A radio frequency pulse 13 is output in the measurement sequence 2, whereupon in a readout time window 14 a k-space row is read out along the X direction. The measurement sequence is spatially resolved in the X direction and the use of the measurement sequence for a large number of k-space rows, in each case after the corresponding preparation sequence 1 or the preparation sequence 1 with inverted gradient pulses, therefore delivers first measurement data 4 and second measurement data 5 for the large number of k-space rows, thus producing a slice image that is resolved in the X and Y direction. If a slice selection gradient is also used, cf. the Z direction in FIG. 3, a resolution also occurs in the Z direction, thus also making it possible to record several slice images as measurement data 4, 5.

The measurement data 4, 5 includes phase images, so that the differential phase produced by the difference formation 15, cf. FIG. 1, may be associated with the eddy current fields occurring as a result of the gradient pulses in the preparation sequence, since these represent the sole difference between the recording of the first measurement data 4 and the second measurement data 5. It is possible to determine the variable characterizing the eddy current fields by evaluation in a step 16. In other embodiments, it is also possible to evaluate the amplitude. For example, for time-resolved measurements, it is also possible to determine time constants of the eddy current fields.

The measurement described may also be carried out for different points in time within the magnetic resonance sequence, different parameterizations of the magnetic resonance sequence and/or different at least one directions of pulse effect to conduct more precise analyses, for example to identify suitable parameterizations of the magnetic resonance sequence in minimize the eddy current effects at critical points in time.

Figure 4:
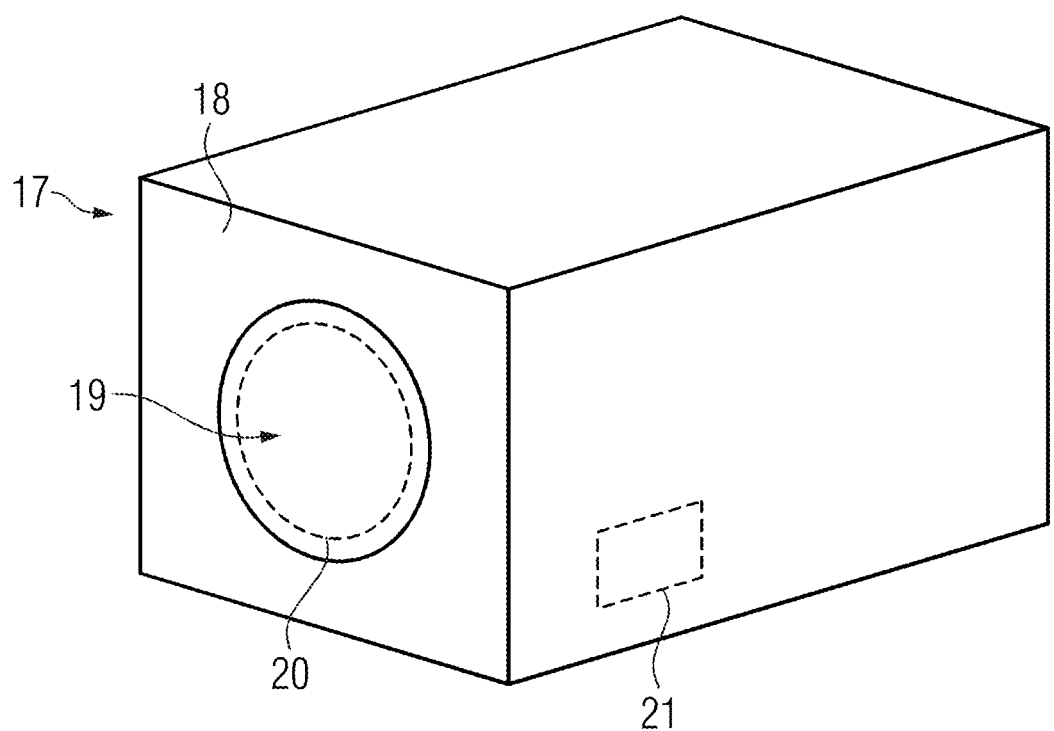
FIG. 4 depicts a magnetic resonance device according to an embodiment.

FIG. 4 depicts a sketch of the principle of a magnetic resonance device 17. The magnetic resonance device 17 includes a main magnet unit 18 with a patient aperture 19 into which a patient may be transported by a patient couch not shown in more detail here. Surrounding the patient aperture 19, in addition to a radio frequency coil arrangement not shown in more detail here, a gradient coil arrangement 20 is provided, that includes gradient coils in each case for the X, the Y and the Z direction. The components of the magnetic resonance apparatus 17 used for imaging are actuated by a control device 21 that is also configured for carrying out the method.

Figure 5:
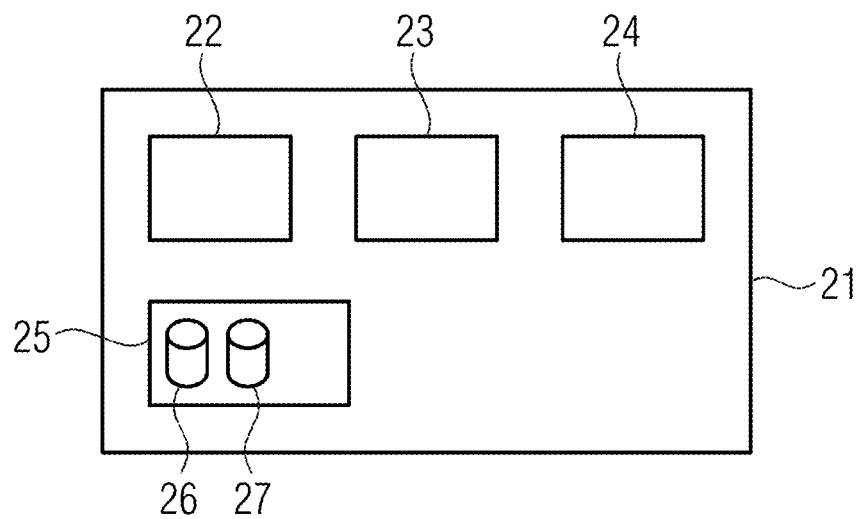
FIG. 5 depicts the functional structure of the control device of the magnetic resonance device of FIG. 4 according to an embodiment.

FIG. 5 depicts the functional structure of the control device 21 in greater detail. The control device 21 includes a selection unit 22, that is used to set the measurement of the eddy current fields. The selection unit 22 may receive for example user inputs that may relate to the at least one direction of pulse effect, the selection of the magnetic resonance sequence, the parameterization of the magnetic resonance sequence, the point in time and/or also the measurement sequence, for example in terms of the k-space to be sampled and the spatial resolution. In a sequence unit 23, the recording of the first measurement dataset 4 and the second measurement dataset 5 then takes place as described in relation to the measurement process 6 from FIG. 1. In an evaluation unit 24, the evaluation according to step 16 then takes place.

Sequences in the control device 21 are programmed in an object-oriented manner. In an embodiment, base classes 26, 27 are present in a storage device 25 of the control device 21 once for the magnetic resonance sequence (and thus also for the preparation sequence) as well as for the measurement sequence. Since the preparation sequence 1 represents a part of the magnetic resonance sequence, it may be derived from a corresponding base class. Embodiments may also provide where a base class 26 is created specifically for the preparation sequence 1. Through multiple inheritance, complete sequences 3 or also the complete sequence of the measurement process 6 may be formed from the base classes 26, 27 by the corresponding elements being concatenated with one another.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for measuring eddy current fields occurring as a result of gradient pulses in an actual magnetic resonance sequence at a point in time during the actual magnetic resonance sequence in relation to at least one direction of pulse effect, the method comprising:

performing a preparation sequence up until the point in time, the preparation sequence comprising at least parts of the actual magnetic resonance sequence comprising gradient pulses relating to the at least one direction of pulse effect;

recording first measurement data during a measurement sequence that directly follows the preparation sequence;

repeating the preparation sequence and the measurement sequence without the gradient pulses relating to the at least one direction of pulse effect or only with gradient pulses relating to the at least one direction of pulse effect that include an inverted sign relating to the at least one direction of pulse effect;

recording second measurement data; and determining, based on the first measurement data and the second measurement data, at least one variable characterizing the eddy current field generated by eddy currents of the gradient pulses in the at least one direction of pulse effect.

2. The method of claim 1, wherein the point in time is selected as a point in time of output of a radio frequency pulse of the actual magnetic resonance sequence or as a point in time of measurement of k-space center.

3. The method of claim 2, wherein the point in time of output of a radio frequency pulse is a preparation pulse.

4. The method of claim 1, wherein the preparation sequence and the measurement sequence are repeated after a waiting period during which the eddy currents decay.

5. The method of claim 1, wherein before each measurement sequence the preparation sequence or elements thereof are performed two or more times.

6. The method of claim 1, wherein the measurement sequence is a gradient echo sequence.

7. The method of claim 1, wherein the measurement sequence measures in a spatially resolved manner in at least one spatial direction.

8. The method of claim 1, wherein the measurement sequence samples just one part of k-space to be sampled, and the first and second measurement data is recorded for all parts of the k-space to be sampled in two or more recording sections.

9. The method of claim 1, wherein determining comprises:

evaluating a phase, an amplitude, or the phase and amplitude of the measurement data to determine the at least one variable.

10. The method of claim 1, wherein the preparation sequence and the measurement sequence are programmed in an object-oriented manner and a combination of preparation sequence and measurement sequence is generated as a complete sequence from a base class describing the actual magnetic resonance sequence.

11. The method of claim 10, wherein a base class is also used for the measurement sequence, wherein the complete sequence is generated using multiple inheritance from both base classes.

12. The method of claim 1, wherein the at least one variable is determined successively for at least one of a plurality of different points in time, directions of pulse effect, or parameterizations of the actual magnetic resonance sequence.

13. The method of claim 1, wherein the at least one variable is determined to parameterize at least one compensation measure for the eddy current field.

14. A magnetic resonance device comprising:

a control device configured to measure eddy current fields occurring as a result of gradient pulses in an actual magnetic resonance sequence at a point in time during the actual magnetic resonance sequence in relation to at least one direction of pulse effect, the control device comprising at least one processor and at least one storage device, the at least one processor configured to:

perform a preparation sequence up until the point in time, the preparation sequence comprising at least parts of the actual magnetic resonance sequence comprising gradient pulses relating to the at least one direction of pulse effect;

record first measurement data during a measurement sequence that directly follows the preparation sequence;

repeat the preparation sequence and the measurement sequence without the gradient pulses relating to the at least one direction of pulse effect or only with gradient pulses relating to the at least one direction of pulse effect that include an inverted sign relating to the at least one direction of pulse effect;

record second measurement data; and determine, based on the first and second measurement data, at least one variable characterizing an eddy current field generated by eddy currents of the gradient pulses in the at least one direction of pulse effect.

15. A non-transitory computer implemented storage medium that stores machine-readable instructions executable by at least one processor for measuring eddy current fields occurring as a result of gradient pulses in an actual magnetic resonance sequence at a point in time during the actual magnetic resonance sequence in relation to at least one direction of pulse effect, the machine-readable instructions comprising:

performing a preparation sequence up until the point in time, the preparation sequence comprising at least parts of the actual magnetic resonance sequence comprising the gradient pulses relating to the at least one direction of pulse effect;

recording first measurement data during a measurement sequence that directly follows the preparation sequence;

repeating the preparation sequence and the measurement sequence without the gradient pulses relating to the at least one direction of pulse effect or only with gradient pulses relating to the at least one direction of pulse effect that include an inverted sign relating to the at least one direction of pulse effect;

recording second measurement data; and determining, based on the first and second measurement data, at least one variable characterizing an eddy current field generated by eddy currents of the gradient pulses in the at least one direction of pulse effect.

16. The non-transitory computer implemented storage medium of claim 15, wherein the point in time is selected as a point in time of output of a radio frequency pulse of the actual magnetic resonance sequence or as a point in time of measurement of k-space center.

17. The non-transitory computer implemented storage medium of claim 15, wherein the point in time of output of a radio frequency pulse is a preparation pulse.

18. The non-transitory computer implemented storage medium of claim 15, wherein the preparation sequence and the measurement sequence are repeated after a waiting period during which the eddy currents decay.

19. The non-transitory computer implemented storage medium of claim 15, wherein before each measurement sequence the preparation sequence is performed two or more times.

20. The non-transitory computer implemented storage medium of claim 15, wherein the measurement sequence is a gradient echo sequence.

\* \* \* \* \*